DIGITALLY PROGRAMMABLE MONOSTABLE MULTIVIBRATOR

Filed May 26, 1967

INVENTOR.
IVARS P. BREIKSS

BY G. Donald Weber Jr.

ATTORNEY.

United States Patent Office 3,539,926
Patented Nov. 10, 1970

3,539,926

DIGITALLY PROGRAMMABLE MONOSTABLE MULTIVIBRATOR

Ivars P. Breikss, Littleton, Colo., assignor to Honeywell Inc., Minneapolis, Minn., a corporation of Delaware Filed May 26, 1967, Ser. No. 641,662
Int. Cl. H03k 21/36
U.S. Cl. 328—41 2 Claims

ABSTRACT OF THE DISCLOSURE

A digitally programmable monostable multivibrator is disclosed wherein a high frequency oscillator is keyed into oscillation by an incoming signal. Simultaneously, an output pulse signal is initiated through logical gate means. The output signals from the oscillator are used to initiate the counting process in a binary counter. Through digitally programmed selection means, the output of a selected one of the counter stages is connected to turn off the oscillator after a predetermined but variable time delay and simultaneously to reverse the state of the gate means to determine the length of the output pulse signal. Means are provided for producing signal which is a proportional to the ratio of ON time to OFF time of the output pulse as a function of the frequency of the input signal.

While not specifically limited thereto, the subject invention is useful in pulse detection schemes. More particularly, the detection schemes may include various types of signal modulation detection. For example, a frequency modulated signal may be operated upon to produce an output level from a device such as a tape recorder or the like. This type of circuit is utilized to produce standard type pulses for all reproduction operations.

Specifically, many tape recorders have provision for different speeds of operation. The speeds may vary between 1.875 and 120 inches per second. With this range of speeds and variations, existing systems are unreliable. For example, existing equipment produces standardized pulses from the tape using a monostable multivibrator. The output of the multivibrator is arranged to be near a fifty percent duty cycle for the carrier frequency. However, in this type of system, when the duty cycle of the monostable multivibrator is changed, the pulse width tends to change. The more drastic the change in the duty cycle, the more severe the change in the pulse width. Additionally, the pulse width tends to vary considerably with temperature.

Also, existing equipment uses relay switching. That is, as the center frequency for the different tape speeds is changed, different timing capacitors are inserted in the circuit to vary the period of the monostable multivibrator. These different timing capacitors are inserted into the circuit by energizing the appropriate associated relays. The relays require considerable space, considerable power and cause troublesome temperature gradients. Moreover, relays are somewhat less reliable than other electronic circuitry.

To avoid these difficulties, the subject invention is provided. This invention provides a digital pulse generator circuit wherein input signals, which are in the form of frequency modulated signals, are supplied to the circuit. A network for doubling the input signal frequency is provided. The input signal may be doubled, or not, selectively. A fixed frequency oscillator is utilized to provide signals. The oscillator is activated by means of a control device which is selectively activated in accordance with the input signals supplied to the circuit. A counter, for example a binary counter, detects the number of signals produced by the oscillator. The counter produces output signals which are indicative of different pulse division rates. Mutually exclusively operable gate means are selectively energized by a tape speed selector device whereby the output of a particular portion of the counter is obtained. The signal is supplied to the aforesaid control means whereby the oscillator is deactivated and turned off. An output signal is supplied by the switch means and is a function of the duration of the counting process. This output signal may be operated upon to give a level output which is indicative of the level of the input signal. In addition, means for quenching input noise are provided.

Consequently, one object of this invention is to provide a digital pulse generator.

Another object of this invention is to provide a digital pulse generator wherein the pulse width of the generated signals is small.

Another object of this invention is to provide a digital pulse generator wherein the narrow-width pulses exhibit little drift over an extended temperature range.

Another object of this invention is to provide a digital pulse generator wherein a duty cycle greater than 50% can be obtained.

Another object of this invention is to provide a digital pulse generator using integrating circuitry therein whereby when the linearity of the system is improved.

These and other objects and advantages of the invention will become more readily apparent when the following description is read in conjunction with the attached drawings, in which.

Figures 1, 2:
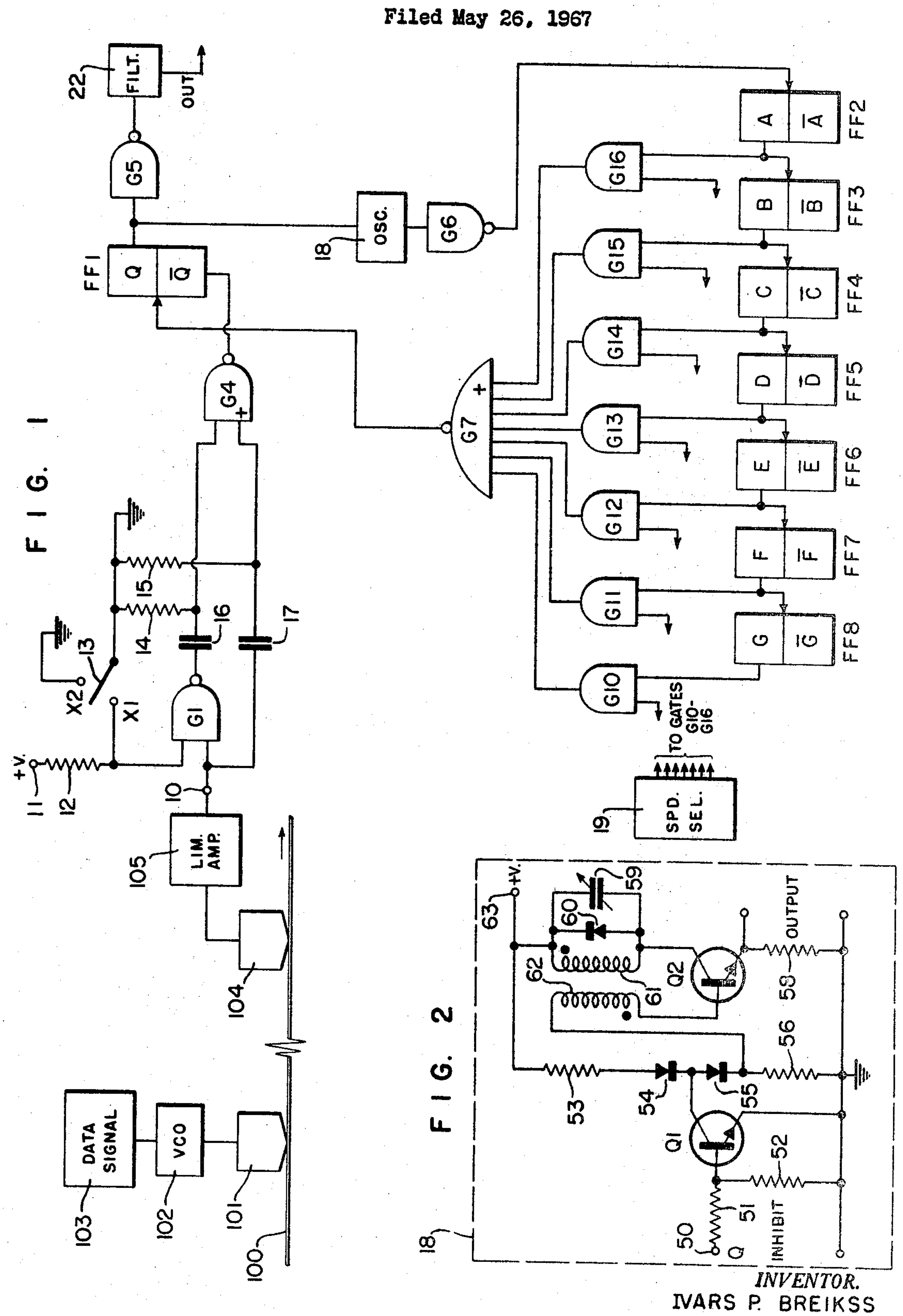
FIG. 1 is a schematic diagram of one embodiment of the invention.
FIG. 2 is a schematic diagram of a typical oscillator used in the system.

Referring now to FIG. 1 there is shown a schematic diagram of a preferred embodiment of the invention. A typical application thereof is suggested by the schematic inclusion of a recording system. The recording system is shown in extremely simplified, schematic form. Typically, a tape or recording medium 100 is utilized. The recording medium moves in the direction suggested by the appended arrow. A recording head 101 is located adjacent to the tape. A voltage controlled oscillator 102 supplies signals to recording head 101 via a typical coil connection. The signals supplied by voltage controlled oscillator 102 may be considered to be the carrier frequency for an FM recording arrangement. A data signal supplying means 103 is connected to the voltage controlled oscillator 102. Thus, as the voltage signal is supplied by the data signal device 103, the signal supplied by VCO 102 is varied. The varied signal is applied to the recording medium 100 via head 101. A reproducing head 104 is shown. This head 104 schematically represents a reproduce head which may be adjacent tape 100 in an integral system or in a separate system. The signal obtained at the coil head 104 is applied to a suitable limiter amplifier 105 for waveshaping. It is understood, of course, that additional circuitry may be included in the recording and reproducing system.

The signal supplied by head 104 is typically sinusoidal in configuration. The limiter circuit 105 may, for example, amplify the signal produced by head 104 and shape the signal into a substantially symmetrical square-wave. The signal produced by limitor circuit 105 is applied to input terminal 10. Input terminal 10 is connected to one input of gate G1 is a NAND gate which produces a low level signal at the output thereof only when both input signals are positive or high signals.

A source 11 which supplies a positive potential, for example +5 volts, is connected via resistor 12 to a second input of gate G1. The second input of gate G1 is also connected to one terminal of switch 13. One terminal of switch 13 is connected directly to the input of gate G1 and is designated the X1 terminal. An additional terminal of switch 13 is connected to ground and is designated the X2 terminal. The armature of switch 13 is also connected to ground. Thus, the second input of gate G1 is selectively connected to ground or to the source 11 (via resistor 12) in accordance with the position of switch 13. In the respective positions, the input frequency is multiplied by unity (X1) or is doubled (X2).

The first input of gate G1 (i.e. terminal 10) is connected via capacitor 17 to an input of gate G4. In addition, this input of gate G4 is connected via resistor 15 to ground. Resistor 15 and capacitor 17 provide a differentiating network.

The output of gate G1 is connected via capacitor 16 to the other input of gate G4. This input of gate G4 is connected via resistor 14 to ground. Resistor 14 and capacitor 16 provide a further differentiating network.

Gate G4 is NOR gate which produces a high level output signal only when the inputs thereto are both low. Any high input to gate G4 produces a low output therefrom. The output from gate G4 is connected to the set input of flip-flop FF1. Typically, flip-flop FF1, as well as the other flip-flops in the circuit, is an integrated circuit type flip-flop arranged in the JK configuration.

The set input supplied by gate G4 is effective to control the level of the output signals Q and $\overline{Q}$. A low input of the set terminal of flip-flop FF1 is effective to produce a low signal at Q and a high signal at $\overline{Q}$. The output Q of flip-flop FF1 is connected to an input of gate G5. Gtae G5 is an inverting gate whereby the output signal is of the logical complement of the input signal. It should be noted that the output signal may be taken separately from the $\overline{Q}$ output of flip-flop FF1 whereby gate G5 may be eliminated.

The output Q of flip-flop FF1 is further connected to the input of oscillator 18 The output of oscillator 18 is connected to gate G6 which is used as an inverter. Gate G6 is used to convert the output of oscillator 18 into a substantially square wave.

The output of gate G6 is connected to the toggle or clock input of flip-flop FF2. Flip-flops FF2 through FF8 are connected together to form a binary counter chain. Thus, the input of each flip-flop is connected (as a toggle input) to the unbarred output of the preceeding flip-flop. For example, flip-flop FF2 has the A output connected to the toggle input of flip-flop FF3. Flip-flop FF3 has the B output connected to the toggle input of flip-flop FF4. Similar connections exist in the other flip-flop. In addition, the unbarred outputs (or toggle inputs) are individually connected to a separate input of each of gates G10 through G16. Other inputs of these gates are connected to the speed selector device 19.

Speed selector device 19 may be a switch or the like which selectively provides a signal at one and only one of a plurality of outputs. This signal is provided to the gate associated with this output and operates as an enabling signal. Thus, when the counter supplies a signal to the enabled gate, a signal is generated by the gate.

The outputs of gates G10 through G16 are connected to the inputs of gate G7. Gate G7 is an inverting type OF gate known as a NOR gate similar to gate G4. The output of gate G7 is connected to the toggle input of flip-flop FF1 and provides a feedback path.

Filtering network 22 operates on the output of gate G5 and comprises well known circuitry.

In a typical operating sequence, an FM signal is supplied to tape 100 by recording head 101. The FM signal is derived by the interaction of the data signal supplied by source 103 and the signal supplied by voltage controlled oscillator 102. The FM signal is reproduced by head 104 and operated upon by limiter amplifier circuit 105 to produce a square-wave signal. The square-wave signal is supplied to input terminal 10.

Switch 13, as noted, may assume either of two positions. If switch 13 is in the X2 position, a signal of approximately +5 volts is supplied from source 11 to one input of gate G1 via resistor 12. Alternatively, if switch 13 is in the X1 position, source 11 is connected to ground via resistor 12 and switch 13. Similarly, the aforesaid input of gate G1 is also connected to ground.

Assume that switch 13 is in the X2 position. Thus, a high input signal is supplied to one input of gate G1. The square-wave signal which is supplied via terminal 10 to another input of gate G1 will control the output signal from gate G1. For example, a negative going edge of the input signal will produce a high level output signal from gate G1. This high level signal is supplied to the resistor 14, capacitor 16 differentiating circuit. A momentary high spike type signal is supplied to one input of gate G4 and produces a low level output signal thereby. Subsequently, the trailing or positive going edge of the input signal is supplied to the differentiating network comprising capacitor 17 and resistor 15. A positive-going spike type signal is applied to the other input of G4. The combination of a low and high input signal at gate G4 produces a low output signal thereby. The low signal produced by gate G4 is applied to the set input of flip-flop FF1 whereby the Q output is a low (or logical zero signal and the Q output is a high (or logical one) signal.

The Q output of flip-flop FF1 is applied to the input of gate G5. Gate G5 inverts the input signal and produces a high output signal. This output signal is applied to a suitable circuit which produces a level signal indicative of the width of the pulse supplied by gate G4.

Concurrently, the Q signal from flip-flop FF1 is applied to oscillator 18. As will be described hereinafter, the Q signal is operative to activate oscillator 18. Oscillator 18, starting with a positive going leading edge, produces output signals which are applied to and inverted by gate G6. These signals are then applied to the toggle input of flip-flop FF2 whereby the counter chain is triggered. It will be noted that oscillator 18 must start with a positive going leading edge inasmuch as inverter gate G6 produces an inverted output signal. Flip-flop FF2 is of the JK type wherein a trailing edge will change the state thereof regardless of the initial state. Thus, by assuring that the output of oscillator 18 begins with a rising leading edge, the counter will always count properly and there will be no half-cycle ambiguity.

The counter circuit comprising flip-flop FF2 through FF8 operates in typical fashion. The output signals from each stage occur at half the frequency of the input signals supplied thereto. In addition, the outputs from each of the respective stages is applied to the associated one of gates G10–G16.

The speed selection device 19 may be manually selected. Assume that selection device 19 produces a signal which is applied to gate G12. No other gate receives an enabling signal. Consequently, when the counter has counted 32 pulses, an output signal E is generated by flip-flop FF6 and is supplied to another input of gate G12. Gate G12 is already enabled by the previously applied enabling signal from speed selecting device 19. An output signal is produced by gate G12 and applied to gate G7. This signal is in the form of a positive going signal.

Gate G7 operates upon the input signals thereto and produces an inverted output. The output signal is supplied to the toggle input of flip-flop FF1. The trailing edge of the signal applied to the toggle input of flip-flop FF1 is operative to change the state of flip-flop FF1.

With the change of state of flip-flop FF1, the Q output signal becomes a high level signal. This high level signal is applied to oscillator 18 and terminates the operation thereof. Concurrently, the high level Q signal is supplied to gate G5 and inverted thereby. The output signal thus switches from the former high state to the low state. It is clear that the duration of the output pulse produced by gate G5 is representative of the number of pulses produced by oscillator 18 during the output pulse. The output of gate G5 may be applied to any typical analyzing circuit such as a filter, integrator or the like wherein the pulse duration is converted to an output level signal which is indicative of the input signal to the pulse generator at terminal 10.

It is obvious that the switching of the state of the input signal at terminal 10 will produce a similar result. That is, the trailing edge will be applied, via the differentiating network comprising resistor 15 and capacitor 17, to one input of the gate G4. Additionally, the trailing edge will be operated upon by gate G1 and produce a signal applied to the other input of gate G4 via the differentiating network comprising resistor 14 and capacitor 16. In essence, the output of gate G1 will be differentiated signal 180° out of phase therewith. Consequently, the output signals from the two differentiators (capacitor 60 and resistor 14, capacitor 17 and resistor 15) will be of opposite polarity such that gate G4 will produce a low output signal. Moreover, since the leading edge of the input signal will produce a high signal at one input of gate G4 and the trailing edge of the input signal will produce a high signal at the other input of gate G4, it is clear that two pulses will be produced by gate G4 for each input pulse supplied at the system.

That is, gate G4 normally supplies a high output signal. Upon the application of a high or positive going spike to either input, a low output of about 30 nanoseconds duration is produced. Since a positive going spike is produced by each edge of the input signal, frequency doubling occurs. On the other hand, when switch 13 is in the X1 position, the input to gate G1 is clamped at approximately ground which is a low signal. With a low signal applied, gate G1 can produce only a high output signal. However, the differentiating network comprising capacitor 16 and resistor 14, produces (after an initial positive going spike) a low signal. Therefore, one input of gate G4 has a continuous low input signal. As the leading and trailing edges of the input signal at terminal 10 are applied, positive and negative going spike signals are supplied, via the differentiating network, to the other input of gate G4. Gate G4 will produce a low output signal only when a high input signal is applied thereto. Since high signals are provided only by the differentiating network consisting of capacitor 17 and resistor 15 the signals produced by gate G4 are of the same frequency as the input signal.

Referring now to FIG. 2, there is shown a schematic diagram of one type of oscillator circuit which may be utilized in the subject circuit. Input terminal 50 is connected to the Q output of flip-flop FF1 in FIG. 1. Terminal 50 is connected via resistor 51 to the base of transistor Q1. The base of transistor Q1 is connected to ground via resistor 52. Transistor Q1, which is an NPN transistor has the emitter thereof connected to ground.

A series circuit comprising resistors 53 and 56 and diodes 54 and 55 is connected between positive potential source 63 and ground. More particularly, diodes 54 and 55 are connected directly to each other and to permit current flow from source 63 to ground. Resistors 53 and 56 are connected, respectively, to the anode of diode 54 and the cathode of diode 55. The junction between the cathode of diode 54 and the anode of diode 55 is connected to the collector electrode of transistor Q1. A winding 62 is connected between the cathode of diode 55 and the base electrode of transistor Q2. Transistor Q2, which is also an NPN transistor, has the emitter thereof connected to ground via resistor 58. Resistor 58 represents the load resistor and the output is taken thereacross. The collector electrode of transistor Q2 is connected to a tank circuit comprising coil 61, diode 60 and variable capacitor 59. The tank circuit is also connected to source 63.

Typically, flip-flop FF1 produces a positive Q output signal. The positive signal is applied to the base of transistor Q1 thereby rendering this transistor conductive. When transistor Q1 is conductive, current flows from source 63 to ground via resistor 53, diode 54 and transistor Q1. Thus, diode 55 and resistor 56 are short circuited. Therefore, substantially ground potential is applied to the base of transistor Q2 via winding 62. This condition maintains transistor Q2 nonconductive and the tank circuit is deactivated. Since no voltage drop exists across resistor 58, the output signal is zero.

When gate 4 supplies a set signal to flip-flop FF1, the Q signal switches to a low signal. A low signal applied at terminal 50 is insufficient to maintain transistor Q1 conductive. When transistor Q1 becomes nonconductive, source 63 is connected to ground via resistor 53, diode 54, diode 55 and resistor 56. With this current path, the potential, at the cathode of diode 55 is approximately +2.5 volts. This potential is applied via coil 62 to the base of transistor Q2. This signal is sufficient to render transistor Q2 conductive. Obviously, as transistor Q2 is rendered conductive, current flows through the tank circuit, transistor Q2 and resistor 58. Consequently, the output signal will start at zero and rise toward a positive value. Thereby the leading edge of the signal produced by the oscillator is a rising signal.

The oscillator shown and described is a typical circuit which may be incorporated into the subject pulse generator. This oscillator is not meant to limit the scope of the invention. Rather, any oscillator may be used so long as it can provide stability despite variations in temperature, supply voltage and the like. Furthermore, it is required that the output signal from the oscillator must always start with a rising or leading edge of a pulse. This requirement avoids possible half cycle ambiguity.

Thus, there has been shown and described a preferred embodiment of a digital pulse generator. In this embodiment, the output signal is applied by the Q output of the flip-flop FF1. As noted, a similar polarity signal can be obtained from output $\overline{Q}$ without the use of gate G5. However, the instant embodiment provides isolation of the load connected to gate G5.

The output pulse applied by the generator is controlled as a function of the input signal and the speed selector switch. The speed selector switch generates an enabling switch signal which permits an output from the generator to terminate the output pulse. The duration of the output pulse can be selected to be:

$$T_o = 2T_{osc}2^M$$

where $T_{osc}$ is the period of the oscillator and M is the number of binaries or flip-flops.

It will become apparent to those skilled in the art that modification of the subject circuit may be effected. However, any modifications which fall within the description of this invention are meant to be included therein.

The embodiments of the invention in which an exclusive property or privilege is claimed are defined as follows:

1. A digitally programmable monostable multivibrator comprising an input circuit, input means for applying a frequency modulated input signal to said input circuit, flip-flop means connected to said input circuit and responsive to each cycle of said input signals applied to said input circuit for effecting the setting of said flip-flop means, a high frequency oscillator, means connecting the output of said flip-flop means to the input of said high frequency oscillator, said oscillator being responsive to signals from said flip-flop means to key said oscillator into oscillation by the setting of said flip-flop means, an output circuit means, means connecting said output circuit means to the output of said flip-flop means, an output pulse being initiated by said setting of said flip-flop means, a binary counter means, means connecting the output of said oscillator means to said counter means, the output pulses of said oscillator being counted by said counter means, digitally programmed selection means connected to said counter to select an output pulse from a selected one of the stages of said binary counter to provide a predetermined time delay signal from said counter, and means connecting the output of said counter to said flip-flop means to reset said flip-flop means in response to said time delay signal whereby to terminate said output pulse, said output circuit means connected to the output of said flip-flop means including means responsive to the output pulses from said flip-flop means to produce an output level signal which varies in level in accordance with said frequency modulated input signal.

2. The invention recited in claim 1 wherein said counter means comprises a plurality of cascaded stages, each of said stages comprising binary switch means, said means for selectively applying an output of said counter means comprising a plurality of gate means, and selector means, said selector means selectively providing an enabling signal to one of said gate means, each of said counter stages having an output respectively connected to a separate associated one of said gate means whereby one of said gate means is operative in response to the simultaneous application of said enabling signal and a signal from the associated counter stage.

References Cited

UNITED STATES PATENTS

| | | | |
|---|---|---|---|
| 3,096,483 | 7/1963 | Ransom | 328—48 |
| 3,226,568 | 12/1965 | Samwel | 328—41 X |
| 3,228,017 | 1/1966 | Owen | 340—174.1 |
| 3,241,017 | 3/1966 | Madsen et al. | 307—226 X |
| 3,287,648 | 11/1966 | Poole | 328—48 |
| 3,369,183 | 2/1968 | Mester | 328—48 |

FOREIGN PATENTS

| | | |
|---|---|---|
| 704,816 | 3/1954 | Great Britain. |

STANLEY D. MILLER, Primary Examiner

U.S. Cl. X.R.

307—225, 233, 265, 271; 328—48; 329—126; 331—173